United States Patent [19]

Hayashi et al.

[11] Patent Number: 5,153,883
[45] Date of Patent: Oct. 6, 1992

[54] DISTRIBUTED TIMING SIGNAL GENERATOR

[75] Inventors: Yoshihiko Hayashi, Yokosuka; Takashi Suga, Yokohama, both of Japan

[73] Assignee: Hitachi, Ltd., Tokyo, Japan

[21] Appl. No.: 349,267

[22] Filed: May 8, 1989

[30] Foreign Application Priority Data

May 10, 1988 [JP] Japan .................. 63-111669

[51] Int. Cl.⁵ .................................. G06F 11/00
[52] U.S. Cl. ............................. 371/27; 371/62
[58] Field of Search ............ 371/27, 61, 62, 21.3, 371/22.1, 21.2

[56] References Cited

U.S. PATENT DOCUMENTS

| | | | |
|---|---|---|---|
| 4,329,640 | 5/1982 | Reiner et al. | 371/27 |
| 4,517,661 | 5/1985 | Graf et al. | 364/900 |
| 4,538,268 | 8/1985 | Pham Van Cang | 371/27 |
| 4,657,406 | 4/1987 | Yaeda | 368/120 |
| 4,670,879 | 6/1987 | Okino | 371/27 |
| 4,797,886 | 1/1989 | Imada | 371/27 |
| 4,802,168 | 1/1989 | Yamanoi et al. | 371/27 |
| 4,827,437 | 5/1989 | Blanton | 364/571.01 |
| 4,845,717 | 7/1989 | Iijima | 371/60 |
| 4,849,702 | 7/1989 | West et al. | 371/27 |
| 4,862,460 | 8/1989 | Yamaguchi | 371/27 |
| 4,928,278 | 5/1990 | Otsuji et al. | 371/27 |

OTHER PUBLICATIONS

IEEE International Test Conference 1983, "Individual Signal Path Calibration for Maximum Timing Accuracy in a High Pincount VLSI Test System", pp. 188-192.
IEEE International Test Conference 1983, "Optimizing the Timing Architecture of a Digital LSI Test System", pp. 200-209.

Primary Examiner—Jerry Smith
Assistant Examiner—Phung M. Chung
Attorney, Agent, or Firm—Fay, Sharpe, Beall, Fagan, Minnich & McKee

[57] ABSTRACT

A distributed timing signal generator as a component of a per-pin architecture tester is disclosed. Start control circuits are provided per pin, and the same start signal is provided from the outside for each of the start control circuits. Each of the start control circuits then determines the start timing for at least one timing generator accommodated therein by the variable set values, and starts to control each timing generator at the thus-determined start timing. Thus, timing signals which correspond to the respective variable set values are produced from the respective timing generators with high timing accuracy and in interlock with each other. It is possible to provide timing generators for a driver, for input/output (I/O) control, and for a comparator, and in this case it is easy to obtain the respective timing signals.

23 Claims, 5 Drawing Sheets

DISTRIBUTED TIMING SIGNAL GENERATOR

BACKGROUND OF THE INVENTION

1. Field of the Invention

The present invention relates to a distributed timing signal generator as a main component of a tester which is suitable for a high timing accuracy test.

2. Description of the Prior Art

Conventionally, when a timing signal which has a period of no integral multiples of T from the base clock having a period of T is formed, the timing signal formed is provided with a high timing accuracy by using one variable delay circuit in a timing signal generating path as a result of the arithmetic processing of the timing setting data, as shown in Japanese Patent Laid-Open No. 12880/1987. As examples of the related arts, the papers "INDIVIDUAL SIGNAL PATH CALIBRATION FOR MAXIMUM TIMING ACCURACY IN A HIGH PINCOUNT VLSI TEST SYSTEM" (IEEE INTERNATIONAL TEST CONFERENCE 1983, PROCEEDINGS (1983) pp. 188 to 192) and "OPTIMIZING THE TIMING ARCHITECTURE OF A DIGITAL LSI TEST SYSTEM" (IEEE INTERNATIONAL TEST CONFERENCE 1983, PROCEEDINGS (1983) pp. 200 to 209) will be cited.

In the above-described prior art, however, neither the interlocking operations of the timing generators nor the control of the starting times of the timing generators is taken into any consideration, so that in a per-pin architecture tester on which a timing generator per pin is mounted, there is a problem in ensuring the skew between pins with high accuracy. In addition, since counters for generating a period and a delay, respectively, are provided separately from each other, the amount of hardware is inconveniently increased in a per-pin architecture tester.

In the former paper, although a per-pin architecture tester is described, no mention is made of the structure and the mutual control of the timing generators, nor the generation of the timing signals for a driver, for input/output (I/O) control, and for a comparator. In the latter paper, although the generation of the timing signals for a driver and for a comparator is described, since the comparison timing signal for the comparator is delayed in a quantitatively analogous way, the tester is unsuitable for a high timing accuracy test.

SUMMARY OF THE INVENTION

Accordingly, it is an object of the present invention to provide a per-pin architecture distributed timing generator in which the interlocking operation and the starting time control of the timing generators are taken into consideration and which is suitable for a high time accuracy test.

It is another object of the present invention to provide a distributed timing signal generator which is capable of generating timing signals for a driver, for input/output (I/O) control, and for a comparator with high time accuracy.

It is still another object of the present invention to provide a distributed timing signal generator in which a timing generator is sufficed with a small amount of hardware.

To achieve this aim, the present invention provides a distributed timing signal generator as a component of a per-pin architecture tester comprising: a synthesizer for generating base clocks; a means for generating a start signal common to a plurality of pins; a distributor for distributing at least the base clocks to the respective pins; start control circuits which are provided in correspondence with the respective pins for outputting start signals at at least two different variable delay timings on the basis of the start signal and the base clocks supplied from the distributor; and timing generators which are started by the respective start signals output from the start control circuits at variable delay timings and generate timing signals having variable periods and phases.

The same start signal is provided from the outside for each of the start control circuits provided in correspondence with the respective pins. Each of the start control circuits then determines the start timing for at least one timing generator accommodated therein by the variable set values, and starts to control each timing generator at the thus-determined start timing. Thus, timing signals which correspond to the respective variable set values are produced from the respective timing generators with high timing accuracy and in interlock with each other. If the distributed timing signal generator is provided with timing generators for a driver, for input/output (I/O) control, and for a comparator, it is easy to obtain timing signals for the driver, for input/output (I/O) control, and for the comparator. In the case of providing two counters which are mutually controlled in a timing generating circuit, the distributed timing signal generator is sufficed with a small amount of hardware.

The foregoing and other objects, advantages, manner of operation and novel features of the present invention will be understood from the following detailed description when read in connection with the accompanying drawings.

DESCRIPTION OF THE PREFERRED EMBODIMENT

The present invention will be explained in more detail with reference to FIGS. 1 to 5.

Figure 1:
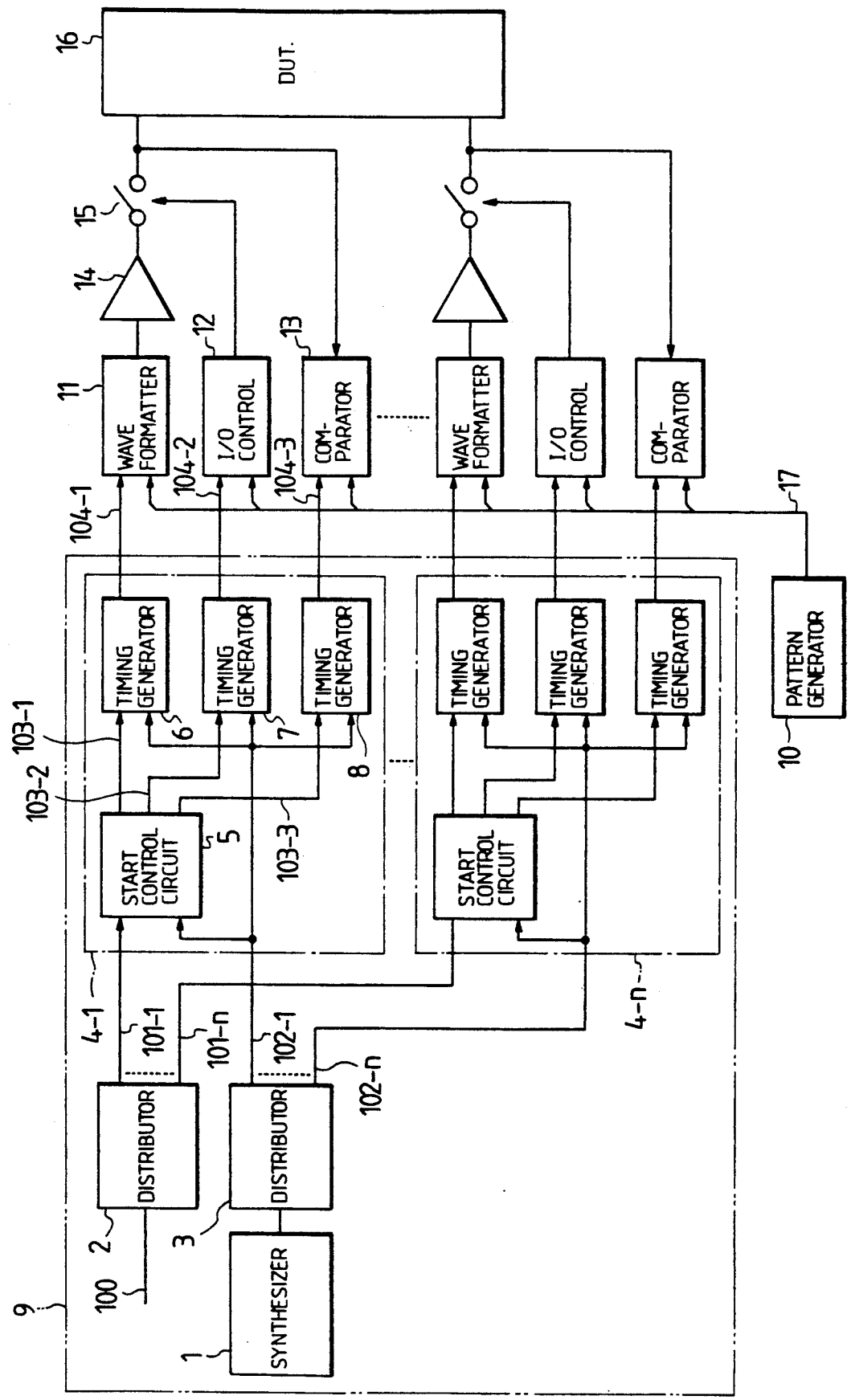
FIG. 1 schematically shows the structure of an example of a per-pin architecture tester incorporating an embodiment of a distributed timing signal generator according to the present invention.

A per-pin architecture tester in accordance with the present invention will first be explained. FIG. 1 schematically shows the structure of a per-pin architecture tester together with a device under test. As shown in FIG. 1, a distributed timing signal generator 9 according to the present invention constitutes a main component of the tester and is composed of timing generation units 4-1 to 4-n provided in correspondence with respective pins, a synthesizer 1 for generating base clocks as a reference for the generation of timings, a distributor 3 for distributing the base clocks to each of the timing generation units 4-1 to 4-n, and a distributor 2 for distributing an appropriately generated start signal 100 to each of the timing generation units 4-1 to 4-n. Each of the timing generation units 4-1 to 4-n is composed of a start control circuit 5 and timing generators 6 to 8. The start control unit 5 in each of the timing generation units 4-1 to 4-n has the same structure but various setting values are programmable as desired. The same is applied to the timing generators 6 to 8.

Figure 3:
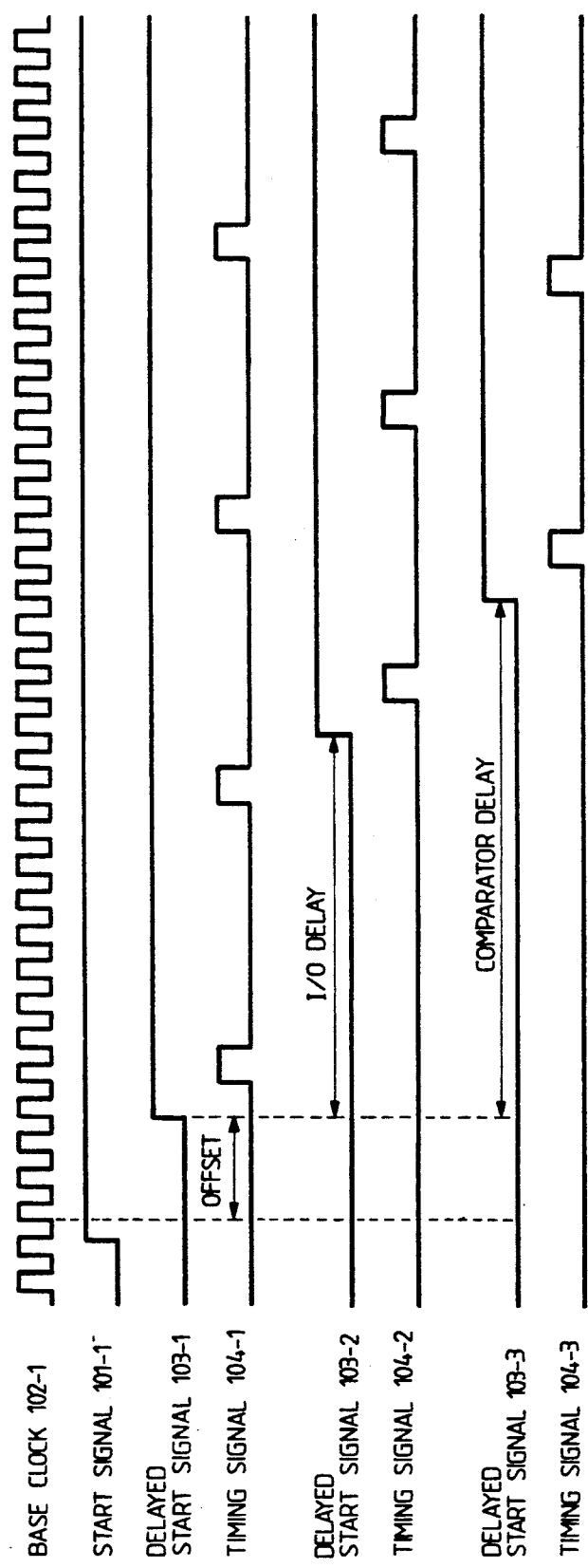
FIG. 3 shows the signal waveforms of the input/output signals of the main elements of the start control circuit shown in FIG. 2 in order to explain the operation thereof.

The base clocks output from the synthesizer 1 are distributed to the timing generation units 4-1 to 4-n through the distributor 3 as base clocks 102-1 to 102-n, and the start signal 100 is distributed to the start control circuits 5 in the respective timing generation units 4-1 to 4-n through the distributor 2 as the start signals 101-1 to 101-n. The operation of these signals in the timing generation unit 4-1, for example, is as shown in FIG. 3. In the start control circuit 5, the start signal 101-1 is delayed by the time corresponding to the set value in accordance with the resolution of the base clock 102-1 so as to produce delayed start signals 103-1 to 103-3 respectively for the timing generators 6 to 8. The timing generators 6 to 8 generate timing signals 104-1 to 104-3, as desired, on the basis of the delayed start signals 103-1 to 103-3, respectively, and the respective set values. Among these timing signals 104-1 to 104-3, the timing signal 104-1 is synthesized with a test pattern 17 from a pattern generator 10 in a wave formatter 11 and the synthesized signal is applied to the device under test (DUT) 16 as a test signal through a driver 14 and an I/O switch 15. The timing signal 104-2 together with the test pattern 17 controls the opening/closing operation of the I/O switch 15 through an I/O controller 12. The timing signal 104-3 designates the timing for comparing a signal output from the device under test 16 with the test pattern 17 in the comparator 13.

The above-described structure and operation of the timing generation unit 4-1 is completely the same with the other timing generation units 4-2 to 4-n.

Figure 2:
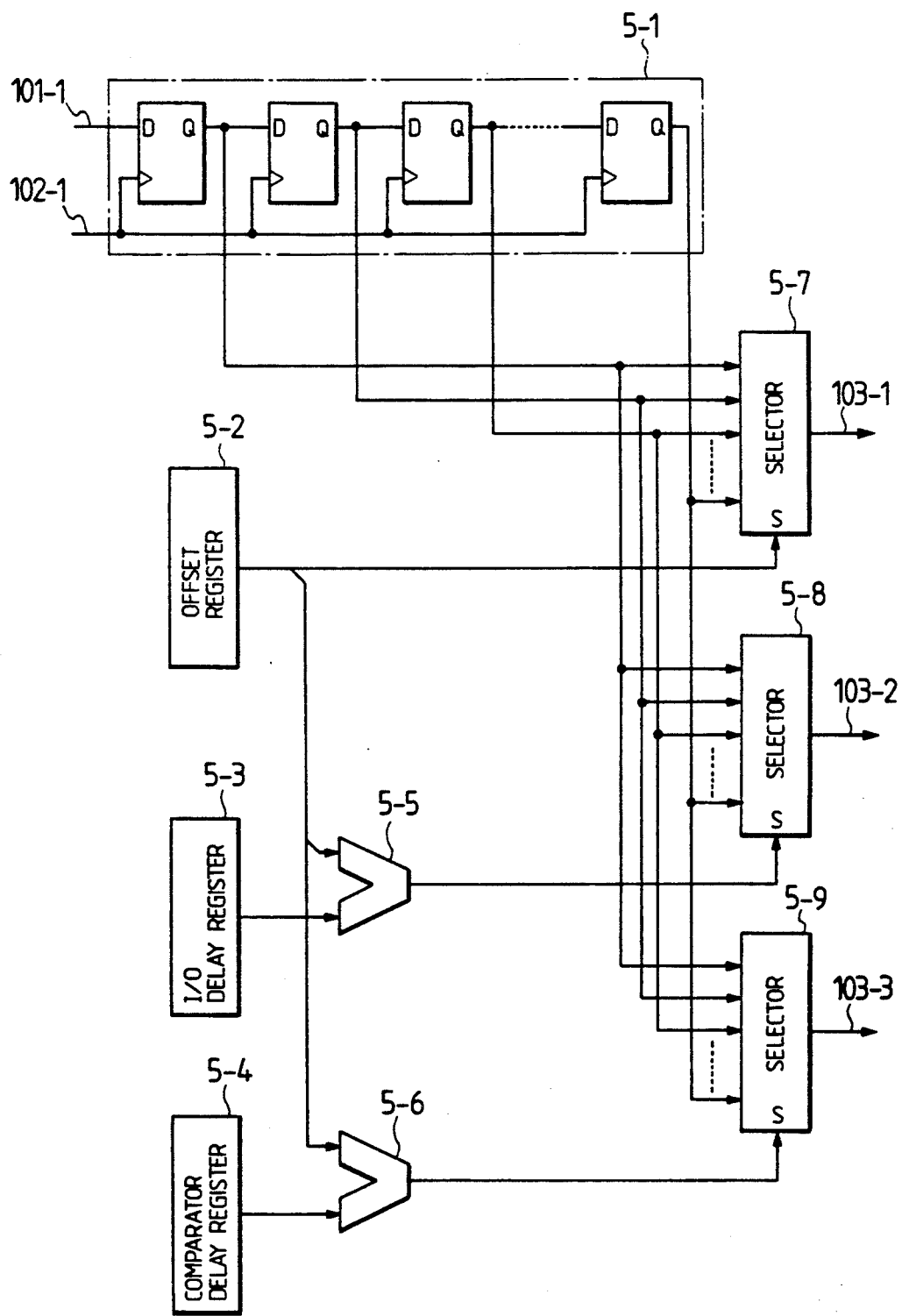
FIG. 2 shows the concrete structure of an example of a start control circuit as the main part of the embodiment shown in FIG. 1.

The start control circuit 5 has a function of starting the timing generators 6 to 8 generally at different timings. The concrete structure of an example of the start control circuit 5 is shown in FIG. 2. The start control circuit 5 is composed of a shift register 5-1 consisting of a plurality of D-type flip-flops which subsequently delay the start signal 101-1 in accordance with the resolution of the base clock 102-1, selectors 5-7 to 5-9 which select an output Q from the outputs Q of the D-type flip-flops, an offset register 5-2 for indicating the delay value in accordance with the resolution of the base clock 102-1, and I/O delay register 5-3, a comparator delay register 5-4, and adders 5-5 and 5-6. Each of the delayed start signals 103-1 to 103-3 is obtained by delaying the start signal 101-1 by the respective predetermined amounts which are determined by the values set in the registers 5-2 to 5-4, respectively. The delayed start signal 103-1 is obtained from the selector 5-7 by delaying the start signal 101-1 by the amount equivalent to (the set value in the register 5-2)×(the period of the base clock 102-1). The delayed start signals 103-2 and 103-3 are obtained from the selectors 5-8 and 5-9, respectively, by delaying the start signal 101-1 by the amount equivalent to (the added set values)×(the period of the base clock 102), the added set values being obtained by adding the set values in the registers 5-3 and 5-4, respectively, to the set value in the register 5-2 by the adders 5-5 and 5-6, respectively. The delay timings of the delayed start signals 103-1 to 103-3 to the start signal 101-1 are varied by varying the setting values in the registers 5-2 to 5-4.

Figure 4:
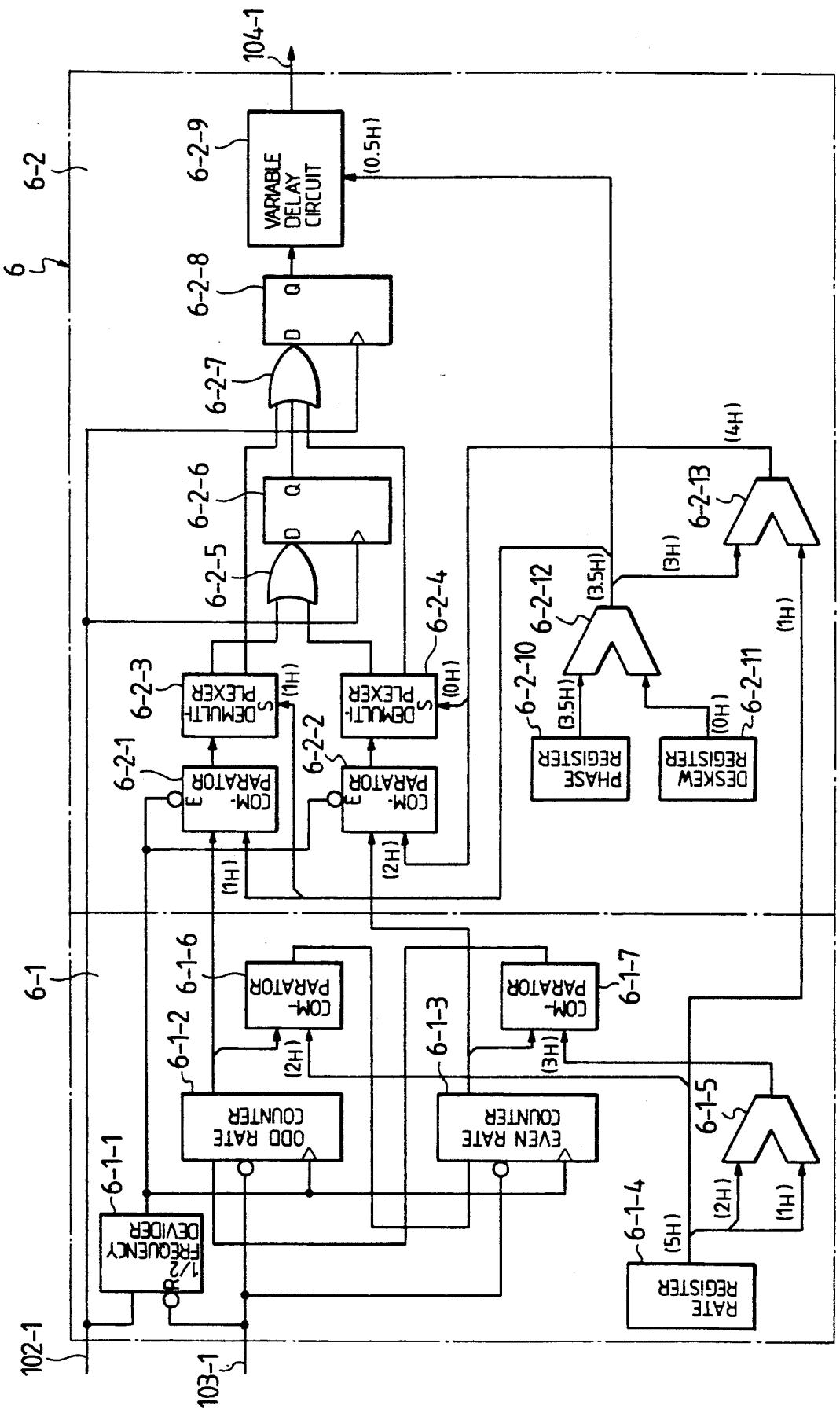
FIG. 4 shows the concrete structure of an example of the timing generator as the main part of the embodiment shown in FIG. 1.

The timing generators 6 to 8 generate the timing signals 104-1 to 104-3 on the basis of the delayed start signals 103-1 to 103-3, respectively. FIG. 4 shows the concrete structure of an example of the timing generator. Although the timing generator 6 is shown in FIG. 4, the timing generators 7 and 8 also have the similar structures. The timing generator 6 itself is mainly composed of a rate generator 6-1 for controlling the period of the timing signal 104-1 and a phase generator 6-2 for controlling the phase of the timing signal 104-1. To state this more concretely, the timing generator 6 is provided with a rate register 6-1-4 for determining the period of the timing signal 104-1, and a phase register 6-2-10 and a deskew register 6-2-11 for determining the delay value of the timing signal 104-1 to the reference phase. In these registers 6-1-4, 6-2-10 and 6-2-11, binary data of, for example, "5", "3.5" and "0" are set as the set values, and the period and the phase of the timing signal 104-1 are controlled on the basis of these set values.

If the set values are set as described above, the comparison value supplied to a comparator 6-1-6 is "$2_H$" (the subscript H represents a hexadecimal notation) obtained by eliminating the least significant bit from the set value "$5_H$" in the rate register 6-1-4, the comparison value supplied to a comparator 6-1-7 is "$3_H$" which is obtained by adding the value "$2_H$" and the least significant bit of the set value "$5_H$" by an adder 6-1-5. The set values "3.5" and "0" in the phase register 6-2-10 and the deskew register 6-2-11, respectively, are added by an adder 6-2-12 to obtain a new set value "3.5", wherein the digits below the decimal point, namely, "0.5" is supplied to a variable delay circuit 5 6-2-9 Among the integer portion "$3_H$" of the set value "3.5", "$1_H$" obtained by eliminating the least significant bit from "$3_H$" is supplied to a comparator 6-2-1 as the comparison value, and the least significant bit "$1_H$" is used as the set value in a demultiplexer 6-2-3. In an adder 6-2-13, the least significant bit "$1_H$" of the set value in the rate register 6-1-4 and the integer portion "$3_H$" are added, and the least significant bit "$0_H$" of "$4_H$", which is the result of addition, is used as the set value in a demultiplexer 6-2-4 and the upper 2 bits "$2_H$" as the comparison value in a comparator 6-2-2.

. The operation of the timing generator 6 under the conditions that the set values are determined as described above will now be explained with reference to FIG. 5. A ½ frequency divider 6-1-1 is originally in the reset state and it is not until the delayed start signal 103-1 is output from the start control circuit 5 that the ½ frequency divider 6-1-1 begins to divide the frequency of the base clocks 102-1.

Figure 5:
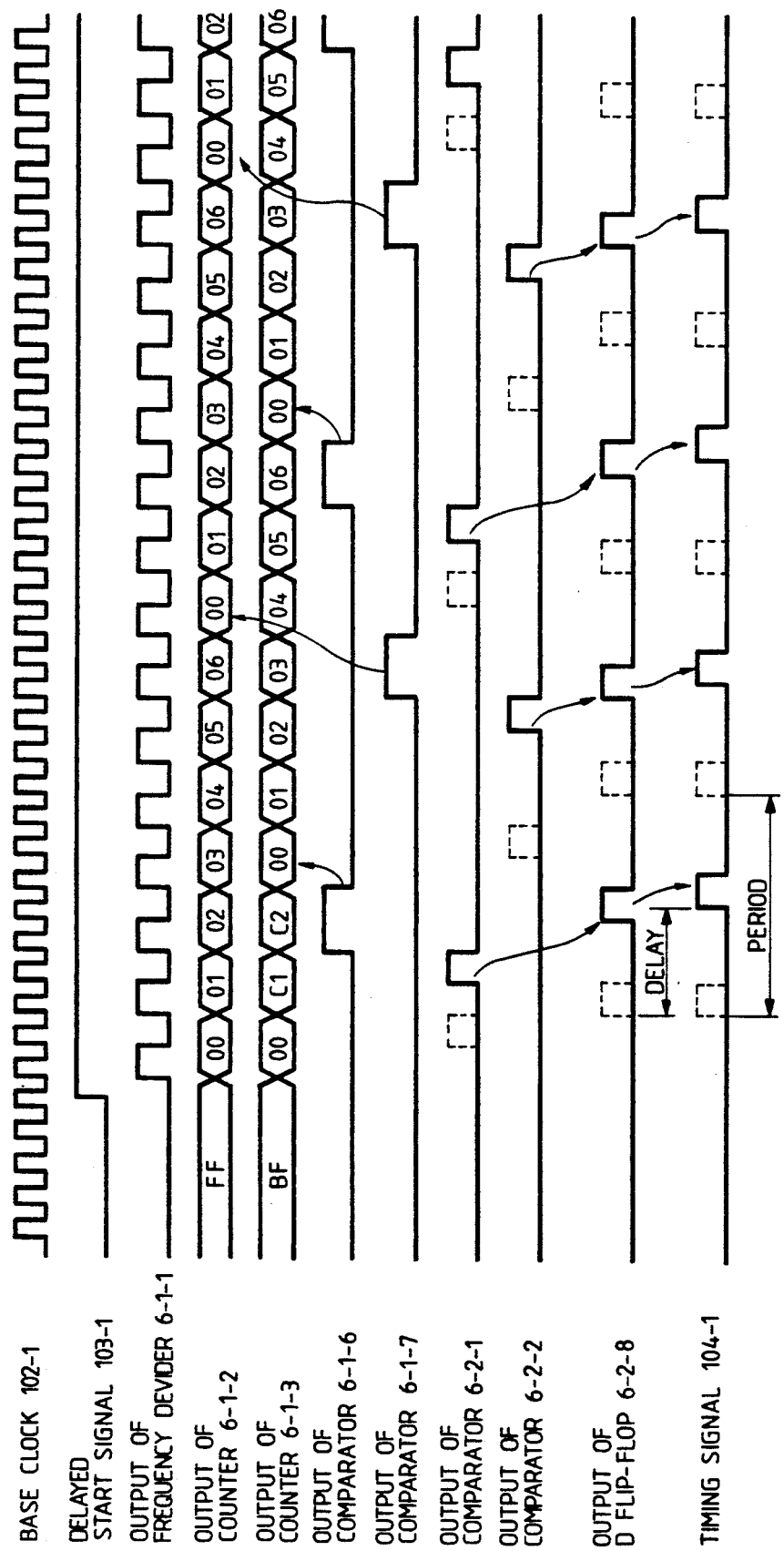
FIG. 5 shows the signal waveforms of the input/output signals of the main elements of the timing generator shown in FIG. 4 in order to explain the operation thereof.

An odd rate counter (8 bits) 6-1-2 and an even rate counter (8 bits) 6-1-3 are originally forced to be in the state of being reset to "FFH" and "BFH", respectively. When the delayed start signal 103-1 is supplied, the preset state is cancelled to count the ½ frequency divided clocks from the ½ frequency divider 6-1-1. When the count value of the counter 6-1-2 or 6-1-3 agrees with the comparison value "$2_H$" or "$3_H$", respectively, in the comparator 6-1-6 or 6-1-7, the agreement output resets the other counter at the next first ½ frequency divided clock. In other words, the counters 6-1-2 and 6-1-3 repeat the operation of a septimal counter. The count values of the counters 6-1-2 and 6-1-3 are compared with the comparison values "$1_H$" and "$2_H$", respectively, in the comparators 6-2-1 and 6-2-2, respectively. When the count value agrees with the comparison value, the agreement output is supplied from the comparator 6-2-1 or 6-2-2 when the ½ frequency divided clock assumes a low-level state. Comparators 6-2-1 and 6-2-2 have inputs from adders 6-2-12 and 6-2-13 that have the indicated outputs, respectively. The agreement output from the comparator 6-2-1 is input to a D-type flip-flop 6-2-6 through the demultiplexer 6-2-3 and an OR-gate 6-2-5 at the base clock 102-1 in accordance with the set value "$1_H$" in the demultiplexer 6-2-3, and is then output to the variable delay circuit 6-2-9 through an OR-gate 6-2-7 and a D-type flip-flop 6-2-8 at a delay of (1×the period of the ½ frequency divided clock). On the other hand, the agreement output from the comparator 6-2-2 is input to the D-type flip-flop 6-2-8 through the demultiplexer 6-2-4 and an OR-gate 6-2-7 at the base clock 102-1 in accordance with the set value "$0_H$" in the demultiplexer 6-2-4, and is then output to the variable delay circuit 6-2-9. The output of the D-type flip-flop 6-2-8 is delayed by the amount equivalent to ½ the period of the base clock on the basis of the set value "0.5", and is obtained as the timing signal 104-1. The broken lines in FIG. 5 show that "0" is set at the set value in the phase register 6-2-10, and there is no change in the other set values.

Accordingly, it is understood that the period of the timing signal 104-1 actually formed is "7" obtained by adding "2" to the set value "5" in the rate register 6-1-4, in other words, it is equivalent to 7 periods of the base clock 102-1. On the other hand, the delay value is obtained by adding the set value in the phase register 6-2-10 and the set value in the deskew register 6-2-11, and is fed to variable delay circuit 6-2-9.

Although the timing generator is composed of one rate generator and one phase generator in this embodiment, it is also possible to connect a plurality of phase generators in parallel to the rate generator. In addition, although a timing generation unit is provided per pin in this embodiment, it is also possible to provide a timing generation unit per several pins.

As described above, according to this embodiment, it is possible to interlock a plurality of timing generation units and start a plurality of timing generators at different timings by a control circuit in each timing generation unit. Since the two counters, namely, the odd rate counter and the even rate counter are mutually controlled in each timing generator, it is possible to set a delay extending over two periods of a timing signal. In addition, since the counters are operated at ½ frequency divided base clock, it is possible to use a frequency freely generated by a synthesizer up to double the frequency for the upper limit operation of each of the counters.

As described above, according to the present invention, since the start control circuit provided per pin can start at least one timing generator at different timings on the basis of a start signal, not only is mutual control of the generations of various timing signals enabled merely by the start signal but also various timing signals can be generated extending over a wide range while ensuring the skew between pins with high time accuracy. Furthermore, when timing generators for a driver, for input/output (I/O) control, and for a comparator are provided separately from each other, the respective timing signals are easily generated. When the timing generator is composed of two mutually controlled counters for controlling the period and the delay of a timing signal, the timing generator is sufficed with a small amount of hardware.

What is claimed is:

1. A distributed timing signal generator as a component of a per-pin architecture tester, comprising:
   a synthesizer for generating and outputting base clocks;
   means for generating and outputting a common start signal;
   a distributor being connected for inputting and for distributing at least said base clocks;
   a plurality of start control circuits, each being connected for inputting respective ones of the base clocks and the common start signal;
   each of said start control circuits outputting respective delayed start signals at at least two different variable delay timings on the basis of said common start signal and the distributed base clocks supplied from said distributor;
   a plurality of timing generators having inputs respectively connected to said start control circuits for receiving respective delayed start signals provided by said start control circuits, at the variable delay timings, and;
   a plurality of output pins, each connected to an output of a different one of said timing generators on a one to one basis;
   one of said timing generators generating a wave formatter signal having a first period and phase; and outputting its timing signal to a corresponding one of said output pins
   another of said timing generators generating a comparator signal having a different period and phase and outputting its timing signal to a corresponding one of said output pins.

2. A distributed timing signal generator according to claim 1, wherein two additional ones of said timing generators are a driver timer generator and an input/output control for generating respective timing signals having different periods and phases and outputting the respective timing signals to respective different ones of the output pins.

3. A distributed timing signal generator according to claim 1, wherein each of said timing generators includes two mutually controlled counters for controlling the period and the delay of a respective one of the timing signals.

4. A distributed timing signal generator according to claim 1, wherein said timing generators are connected for inputting the base clocks and each of said timing generators generating the timing signals having variable periods and phases on the basis of the distributed base clocks.

5. A distributed timing signal generator according to claim 4, wherein two additional ones of said timing generators include at least timing generators for a driver timer generator and an input/output control for generating respective timing signals having different periods and phases and outputting the respective timing signals to respective different ones of the output pins.

6. A distributed timing signal generator according to claim 5, wherein each of said timing generators includes two mutually controlled counters for controlling the period and the delay of a respective one of the timing signals.

7. A distributed timing signal generator according to claim 1, wherein said timing generators generate the timing signals at fewer timings than the base clocks.

8. A per-pin architecture tester of an electronic component having a plurality of pins, comprising:
- a plurality of separate connector means for respectively connecting to a corresponding number of the pins;
- first distributor means having a plurality of first outputs and for distributing common start signals respectively to said plurality of first outputs, each corresponding to and equal in number to said number of the pins;
- second distributor means having a plurality of second outputs and for distributing common base clocks respectively to said plurality of second outputs, each corresponding to and equal in number to said number of the pins;
- a plurality of timing generation units equal in number to said number of the pins and each having a first input connected to a respective one of said first outputs and a second input connected to a respective one of said second outputs for receiving respectively one of the start signals and one of the common base clocks;
- each of said timing generation units producing at least a comparator output signal and a wave formatter output signal from the respective common start signal and common base clock, and the output signals differing from each other in at least one of period and phase;
- means connecting said timing generation units to respective connector means for connecting said output signals to respective pins.

9. The device of claim 8, wherein each of said timing generation units produces the output signals differing in both phase and period.

10. The device of claim 9, wherein said timing generation units each include a plurality of timing generators respectively for generating the output signals, each timing generator having storage means for storing a rate value and storage means for storing a phase value, and each timing generator including a circuit determining the period of the respective output signal from the stored rate value and a circuit for determining the phase of the respective output signal from the stored phase value.

11. The device of claim 10, wherein each of said timing generation units includes a start control circuit responsive to the common start signal for producing a delayed start signal delayed with respect to said common start signal for starting the respective output signals.

12. The device of claim 10, wherein each of said timing generation units includes a start control circuit for producing a plurality of delayed start signals from the common start signal, for respectively determining the start timing of the output signals of each timing generation unit.

13. The device of claim 12, wherein said start control circuit includes at least two different delay registers respectively setting different delay values, for determining the delay of respective delayed start signals.

14. The device of claim 12, wherein said start control circuit includes at least three different delay registers respectively setting different delay values, for determining the delay of respective delayed start signals.

15. The device of claim 10, wherein each of said timing generation units provides the output signals respectively as periodic wave forms starting at different delayed times with respect to the common start signal so that the output signals are respectively a wave formatter timing signal, and input/output timing signal and a comparator timing signal; and each of said timing generation units including
- pattern generator means for generating a test pattern signal,
- a wave formatter means receiving inputs of the test pattern signal and the wave formatter timing signal and for producing a test signal, an input/output control means for producing a test signal, and the input/output timing signal and for producing a switching output signal, and switching means responsive to said switching output signal for electrically connecting the test signal from said wave formatter to said means connecting.

16. The device of claim 15, including a comparator having an input connected to the connector means for receiving a device signal from the electronic component being tested, an input receiving the test pattern signal, and an input receiving an output signal from a respective timing generation unit for comparing the electronic component output signal with the test pattern signal in accordance with a timing of the output signal from the respective timing generation unit.

17. The device of claim 8, wherein said timing generation units each include a plurality of timing generators respectively for producing the output signals, each timing generator having storage means for storing a rate value and storage means for storing a phase value, and each timing generator including circuit means for determining the period of one of the output signals from the stored rate value and circuit means for determining the phase of one of the output signal from the stored phase value.

18. The device of lima 8, wherein each of said timing generation units includes a start control circuit responsive to the common start signal for producing a delayed start signal delayed with respect to said common start signal for starting its respective one of the output signals.

19. The device of claim 8, wherein each of said timing generation units includes a start control circuit for producing a plurality of delayed start signals from the common start signal, for respectively determining the start timing of the output signals of each of said timing generation units.

20. The device of claim 19, including at least two different delay registers respectively setting different delay values, and said start control circuit determining the delay of respective delayed start signals from the delay values.

21. The device of claim 19, including at least three different delay registers respectively setting different delay values, and said start control circuit determining the delay of respective delayed start signals from the delay values.

22. The device of claim 8, wherein each of said timing generation units provides the output signals as periodic wave forms starting at different delayed times from the common start signal so that the output signals are a wave formatter timing signal, an input/output timing signal and a comparator timing signal; and including each of said timing generation units having pattern generator means for generation a test pattern signal;

a wave formatter means for receiving an input of the test pattern signal and the wave formatter timing signal and for producing a test signal;

an input/out control means for receiving an input of the test pattern signal and the input/output timing signal and for producing a switching output signal; and switching means responsive to the switching output signal for electrically connecting the test signal from said wave formatter to said means connecting.

23. The device of claim 22, further including a comparator having an input connected to the connector means for receiving a device signal from the electronic component, an input receiving the test pattern signal, and an input receiving an output signal from a respective timing generation unit for comparing the device output signal with the test pattern signal in accordance with a timing of the output signal from the generation unit to produce an output.

* * * * *